United States Patent
Brisbin et al.

(10) Patent No.: US 8,086,979 B2
(45) Date of Patent: Dec. 27, 2011

(54) METHOD FOR DESIGNING AND MANUFACTURING A PMOS DEVICE WITH DRAIN JUNCTION BREAKDOWN POINT LOCATED FOR REDUCED DRAIN BREAKDOWN VOLTAGE WALK-IN

(75) Inventors: Douglas Brisbin, San Jose, CA (US); Andrew Strachan, Santa Clara, CA (US)

(73) Assignee: National Semiconductor Corp., Santa Clara, CA (US)

( * ) Notice: Subject to any disclaimer, the term of this patent is extended or adjusted under 35 U.S.C. 154(b) by 364 days.

(21) Appl. No.: 12/480,916

(22) Filed: Jun. 9, 2009

(65) Prior Publication Data
US 2009/0254872 A1    Oct. 8, 2009

Related U.S. Application Data

(62) Division of application No. 11/705,975, filed on Feb. 14, 2007, now Pat. No. 7,560,348, which is a division of application No. 10/825,833, filed on Apr. 16, 2004, now Pat. No. 7,180,140.

(51) Int. Cl.
*G06F 17/50* (2006.01)
(52) U.S. Cl. ........ 716/110; 716/100; 716/122; 257/355; 257/361; 438/286
(58) Field of Classification Search .................. 716/100, 716/110, 122; 257/355, 361; 438/202, 217, 438/286
See application file for complete search history.

(56) References Cited

U.S. PATENT DOCUMENTS

| 5,306,652 A | 4/1994 | Kwon et al. .................. 438/283 |
| 2003/0011039 A1 | 1/2003 | Ahlers et al. |
| 2003/0122195 A1 | 7/2003 | Tada et al. |
| 2004/0173859 A1* | 9/2004 | Hao et al. ...................... 257/408 |

OTHER PUBLICATIONS

D. Brisbin, A. Strachan, and P. Chaparala, "Breakdown Walk-in: A New PMOS Failure Mode in High Power BiCMOS Applications," presented at the IEEE 2003 International Integrated Reliability Workshop, at S. Lake Tahoe, California, on Oct. 22, 2003, and published in the 2003 IEEE International Integrated Reliability Workshop Final Report (Feb. 2004) (four pages).

* cited by examiner

*Primary Examiner* — Vuthe Siek
(74) *Attorney, Agent, or Firm* — Girard & Equitz LLP

(57) ABSTRACT

A PMOS device can be designed and manufactured in accordance with the invention to locate its drain junction breakdown point and maximum impact ionization point to reduce or eliminate drain breakdown voltage walk-in. In some embodiments, the drain junction breakdown point and maximum impact ionization point are located sufficiently far from the gate that the device exhibits no significant drain breakdown voltage walk-in. The device can be a high voltage power transistor having an extended drain region including a P-type lightly doped drain (P-LDD) implant, with drain junction breakdown and maximum impact ionization points appropriately located by controlling the implant dose employed to produce the P-LDD implant. Other aspects of the invention are methods for designing a PMOS device including by determining relative locations of the gate and at least one of the drain junction breakdown and maximum impact ionization points to reduce drain breakdown voltage walk-in, and methods for manufacturing integrated circuits including any embodiment of the PMOS device of the invention.

11 Claims, 5 Drawing Sheets

METHOD FOR DESIGNING AND MANUFACTURING A PMOS DEVICE WITH DRAIN JUNCTION BREAKDOWN POINT LOCATED FOR REDUCED DRAIN BREAKDOWN VOLTAGE WALK-IN

CROSS-REFERENCE TO RELATED APPLICATIONS

This is a divisional of U.S. patent application Ser. No. 11/705,975, filed on Feb. 14, 2007 (issued as U.S. Pat. No. 7,560,348 on Jul. 14, 2009), entitled METHOD FOR DESIGNING AND MANUFACTURING A PMOS DEVICE WITH DRAIN JUNCTION BREAKDOWN POINT LOCATED FOR REDUCED DRAIN BREAKDOWN VOLTAGE WALK-IN, and assigned to the assignee of the present application, which is a divisional of U.S. patent application Ser. No. 10/825,833, filed on Apr. 16, 2004 (issued as U.S. Pat. No. 7,180,140), entitled PMOS DEVICE WITH DRAIN JUNCTION BREAKDOWN POINT LOCATED FOR REDUCED DRAIN BREAKDOWN VOLTAGE WALK-IN AND METHOD FOR DESIGNING AND MANUFACTURING SUCH DEVICE, also assigned to the assignee of the present application.

BACKGROUND OF THE INVENTION

1. Field of the Invention

The present invention pertains to metal-oxide-semiconductor field effect (MOS) devices and methods for manufacturing MOS devices and integrated circuits including them. In preferred embodiments, the invention pertains to methods for manufacturing p-channel MOS devices (PMOS devices) to reduce or eliminate the dependence of their drain breakdown voltage on stress factors (e.g., temperature stress and/or voltage stress).

2. Description of the Related Art

The expression "MOS device" is used herein as a synonym for an MOS transistor.

Commonly, power management circuits (e.g., DC-DC converters and other circuits for smart power management applications) are required to operate at high voltages (e.g., in the 50V to 100V range). Some such circuits are manufactured in accordance with a BiCMOS process and include bipolar, PMOS, NMOS, and power DMOS (double diffused metal oxide semiconductor) devices on a single chip, including low to medium voltage (5V-15V) as well as high voltage devices. In such circuits the high voltage PMOS ("HV-PMOS") transistors must be able to operate at high currents, high voltages (e.g. 80V) and high temperatures (150° C.) while sustaining a drain breakdown voltage well in excess of the device operating voltage. In a typical high power application the HV-PMOS devices are expected to operate at a gate voltage of 14V, a drain voltage of 80V and a temperature of 150° C. while having a drain breakdown voltage (Bvdss) well above 80V. Because of the high voltages, currents and temperatures seen by these devices the long-term reliability is a key concern.

FIG. 1 is a cross-sectional view of a conventional HV-PMOS device manufactured in accordance with a BiCMOS process, including gate 1, source 2, drain 3, N-type epitaxial layer 4, gate oxide 5 under gate 1, and N-type substrate 8. Gate oxide 5 consists of silicon dioxide having a thickness of 38 nm. The FIG. 1 device differs from a traditional MOS device in that it has an asymmetric device architecture that includes an extended drain region consisting of a P-type lightly doped drain (P-LDD) implant 6 and a P-type deep drain (P-Body) implant 7 in layer 4. P-LDD implant 6 and P-Body implant 7 increase the device's drain breakdown voltage and thus increase its maximum operational voltage. Critical device parameters include the length of gate 1, and the doping concentration and length of P-LDD implant region 6 since these must sustain the high voltages (e.g., 100V) to be applied to the device.

The expression "hot carrier ionization" (in an MOS device) is used herein to denote the phenomenon that energetic ("hot") carriers in the drain or extended drain region or body of the device (e.g., in a well/drain depletion region) ionize atoms (usually silicon atoms) in the drain or extended drain region or body, thereby creating electron-hole pairs. The carriers can be electrons or holes.

The expression "maximum impact ionization point" is used herein to denote the region in an MOS device in which the probability of hot carrier ionization exceeds an appropriately defined threshold.

The expression "drain breakdown" (of an MOS device) is used herein to denote the avalanche breakdown of a p-n junction at the drain (or extended drain region) of the device. If the device has an extended drain region including a drain, a lightly doped drain (P-LDD) implant, and a P-type deep drain (P-Body) implant, the p-n junction at which breakdown occurs can be at the P-LDD implant or the P-Body implant. In cases when drain breakdown has occurred, increased current flows to or from the drain when the device's gate, source, and substrate are grounded.

The expression drain junction "breakdown point" (or drain junction "breakdown location") is used herein to denote the region in an MOS device in which drain breakdown occurs. The "maximum impact ionization point" of a device can but need not coincide with the device's drain junction "breakdown point."

Throughout this disclosure, the expression "drain breakdown voltage" (or "Bvdss") of an MOS device denotes the minimum absolute value of the drain voltage ($V_{DS}$) with the gate, source and substrate grounded that causes the device to exhibit drain breakdown, where $V_{DS}$ is the potential applied to the device's drain relative to the source.

The expressions Bvdss "walk-in" and Bvdss "walk-out" are used herein as follows with reference to an MOS device that has undergone stress: Bvdss "walk-in" denotes the phenomenon that the magnitude of the device's post-stress drain breakdown voltage is less than its pre-stress drain breakdown voltage; and Bvdss "walk-out" denotes the phenomenon that the magnitude of the device's post-stress drain breakdown voltage is greater than its pre-stress drain breakdown voltage.

Drain breakdown voltage walk-in (Bvdss walk-in) can cause functional PMOS device failure, such as during high temperature (e.g., 150° C.) operation as may occur in operational lifetime testing.

It has been known that application of stress to a PMOS device can cause Bvdss walk-in. However, it had not been known until the present invention what parameters of the design (or method of fabricating) a PMOS device are critical to reducing or eliminating its susceptibility to Bvdss walk-in. Nor had it been known until the present invention how to perform modification to the design of a PMOS device (or modification to its fabrication method) to reduce or eliminate the device's susceptibility to Bvdss walk-in. For example, it had not been known until the present invention how to modify a parameter of an ion implantation process employed to fabricate an extended drain region of a PMOS device to reduce (or eliminate) the device's susceptibility to Bvdss walk-in.

BRIEF DESCRIPTION OF PREFERRED EMBODIMENTS

In a class of embodiments, a PMOS device is designed and manufactured in accordance with the invention such that its drain junction breakdown point and maximum impact ionization point are located to reduce Bvdss walk-in below a predetermined value. In some embodiments, a PMOS device is designed and manufactured such that both its drain junction breakdown point and maximum impact ionization point are located to be sufficiently far from its gate that the device exhibits no significant Bvdss walk-in.

In a class of embodiments, the inventive device is a high voltage PMOS power transistor (an "HV-PMOS" device) having an extended drain region. The extended drain region includes a P-type lightly doped drain (P-LDD) implant. In some such embodiments, the drain junction breakdown point and maximum impact ionization point of the device are located as desired (relative to the edge of the gate) by controlling the implant dose employed to produce the P-LDD implant. For example, in some embodiments the P-LDD implant is produced (in a manner that locates the drain junction breakdown point and maximum impact ionization point in the device body far from the gate edge) by an ion implantation process in which the ion dose is much less than a conventional dose that would locate the drain junction breakdown point and maximum impact ionization point at the device surface near the gate edge of the gate. For example, the ion dose in accordance with the invention may be $1.15 \times 10^{12}$ ions/cm$^2$, in contrast with a conventional dose of $2.23 \times 10^{12}$ ions/cm$^2$.

Another aspect of the invention is a class of methods for designing a PMOS device, including by determining relative locations of the device's gate, and at least one of the device's drain junction breakdown point and maximum impact ionization point, which cause the device to exhibit no Bvdss walk-in in excess of a predetermined value (or to exhibit no significant Bvdss walk-in). Preferably, the locations of both the drain junction breakdown point and maximum impact ionization point are optimized to be sufficiently far from the gate to cause the device to exhibit no significant Bvdss walk-in.

Another aspect of the invention is a class of methods for manufacturing an integrated circuit (chip) including at least one PMOS device whose gate, drain junction breakdown point, and maximum impact ionization point are located to cause the device to exhibit no Bvdss walk-in in excess of a predetermined value (or to exhibit no significant Bvdss walk-in). In some embodiments, the method includes the step of manufacturing the gate, the body, and the drain (or extended drain region) such that the gate, the drain junction breakdown point, and the maximum impact ionization point have relative positions that cause the device to exhibit no drain breakdown voltage walk-in in excess of the predetermined value. Preferably, the location of each of the drain junction breakdown point and the maximum impact ionization point is sufficiently far from the gate to cause the device to exhibit no significant Bvdss walk-in.

Other aspects of the invention are methods for designing any embodiment of the inventive PMOS device (or an integrated circuit including any embodiment of the inventive PMOS device), and methods for manufacturing an integrated circuit including any embodiment of the inventive PMOS device.

DETAILED DESCRIPTION OF PREFERRED EMBODIMENTS

The inventors have identified a failure mechanism in PMOS devices (e.g., HV-PMOS devices) that can result in functional quiescent current failure, for example, during high temperature operational life testing. In devices subject to this mechanism, the drain junction breakdown point and maximum impact ionization point are both located at the device surface near the gate edge. An aspect of the failure mechanism is drain breakdown voltage walk-in caused by positive charge injection to the gate oxide (during stressed operation of the device). The positive charge injection to the gate oxide is primarily caused by hot carrier ionization in the maximum impact ionization point. Accumulation of injected positive charge in the gate oxide enhances the surface electric field of the device, thereby reducing the drain breakdown voltage of the device over time (while the device is subjected to stress). By the end of the stress period, this drain breakdown voltage walk-in has reduced the drain breakdown voltage sufficiently that the device experiences drain breakdown (and fails) in response to assertion of normal operating voltages thereto.

In a class of embodiments, the invention improves the reliability of HV-PMOS devices by improving drain breakdown voltage stability. HV-PMOS transistors are typically used at high voltages (e.g., 100V). Under these conditions drain breakdown voltage walk-in can occur in a conventionally designed HV-PMOS device and cause the drain breakdown voltage of the device to decrease below the operation voltage of the device, in turn causing increased quiescent current and product failure.

The inventors have determined that drain breakdown voltage walk-in (in conventional HV-PMOS devices whose drain junction breakdown point and maximum impact ionization point are both located near the gate oxide) can result from positive charge (hole) injection into the gate oxide near the drain junction breakdown point. This injected positive charge enhances the surface electric field of each such conventional device, reducing the drain breakdown voltage of the device over time (when the device is subjected to stress). In accordance with some embodiments of the present invention, an optimized p-type lightly doped drain (P-LDD) implant is produced in an HV-PMOS device which causes the drain junction breakdown point to be located away from the gate oxide (and the surface of the device) to reduce (or eliminate) positive charge injection to the gate oxide during stress (e.g., positive charge injection causes by hot carrier ionization). Such positive charge injection would otherwise cause drain breakdown voltage walk-in.

Figure 1:
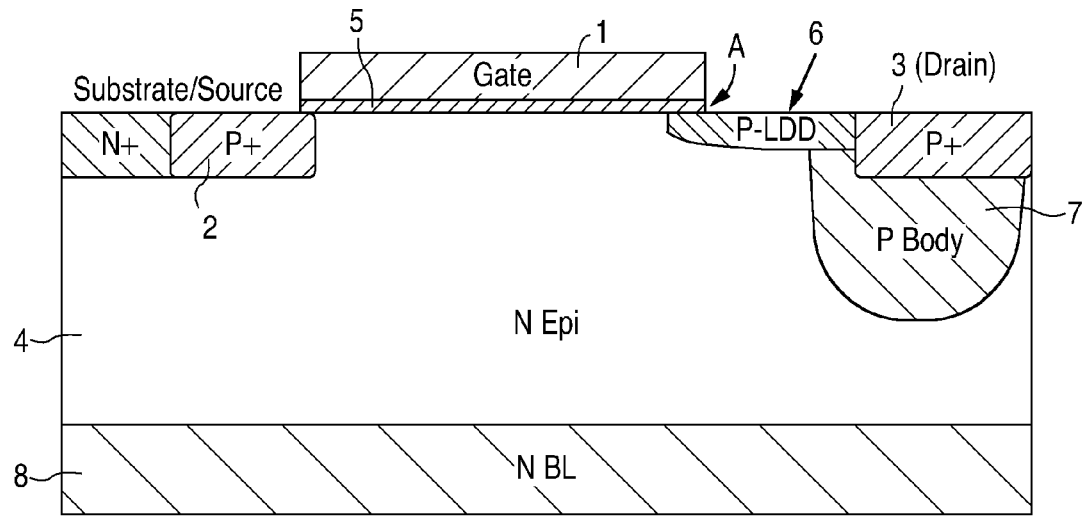
FIG. 1 is a cross-sectional view of a conventional BiCMOS transistor structure.

The inventors have performed high temperature stress testing on HV-PMOS devices having the structure shown in FIG. 1 with gate length of 3.5 mm and gate width of 160 mm. The devices' P-LDD implant 6 had been produced conventionally by implanting boron with an implant dose of $2.23 \times 10^{12}$ ions/cm$^2$ and an implant energy of 50 Kev. During the stress testing, the drain breakdown voltage ("Bvdss") of each device was monitored after each stress time interval. Stress times were logarithmic time intervals (e.g., 10 seconds, 30 seconds, 100 seconds, 300 seconds, etc.). The Bvdss was determined using a drain voltage sweep method with a sweep rate of 5 V/s, a current limit of 50 nA and the device gate, source and substrate grounded.

High temperature stress testing (as described in the previous paragraph) on some HV-PMOS devices of the described type identified Bvdss walk-out (e.g., a pre-stress breakdown voltage Bvdss magnitude of 90V and a post-stress breakdown voltage Bvdss magnitude of 118V), and such high temperature stress testing on other HV-PMOS devices of the described type identified Bvdss walk-in (e.g., a pre-stress breakdown voltage Bvdss magnitude of 90V and a post-stress breakdown voltage Bvdss magnitude of 62V). Bvdss walk-out is typically not a problem in circuits but Bvdss walk-in typically is an important issue since stress on a device subject to Bvdss walk-in can cause the drain breakdown voltage to fall below the operating voltage leading to increased drain leakage current and eventual device catastrophic failure.

Figure 2:
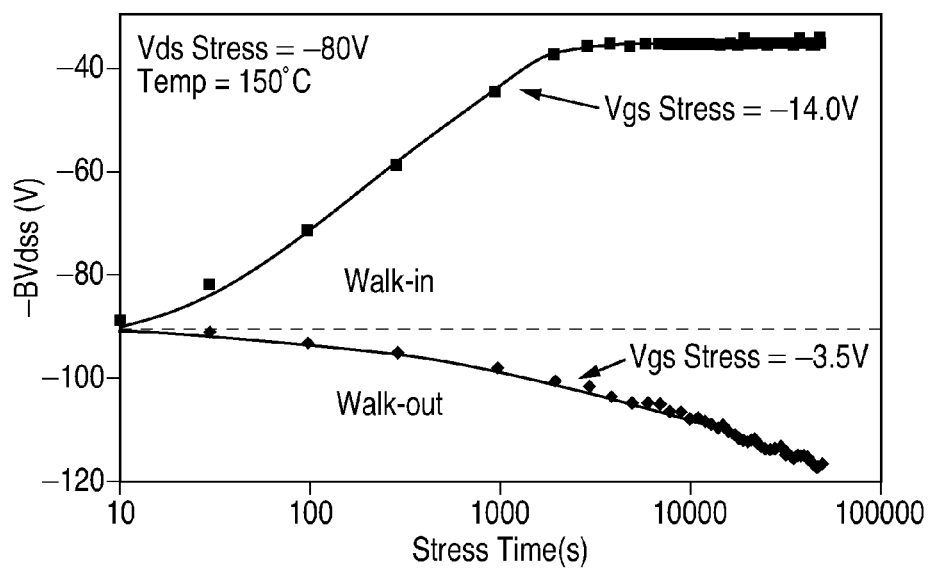
FIG. 2 is graph of measured drain breakdown voltage (Bvdss) of HV-PMOS devices (each having the FIG. 1 structure and a conventionally produced P-LDD implant 6) versus stress time, while the devices are subjected to stress.

Measurements were made of Bvdss (of HV-PMOS devices having the FIG. 1 structure) versus stress time. A first device of this type was subjected to $V_{GS}$ stress with a gate voltage ($V_{GS}$) of −3.5V and a second device of this type was stressed at a gate voltage of −14V. As shown in FIG. 2, the first device (subjected to the $V_{GS}$ stress of −3.5V) exhibited increasing Bvdss walk-out (from a pre-stress Bvdss magnitude of 90V to a maximum post-stress Bvdss of 117V) with increasing stress time. FIG. 2 also shows that the second device (subjected to the $V_{GS}$ stress of −14V) exhibited Bvdss increasing Bvdss walk-in (from a pre-stress Bvdss magnitude of 90V to a minimum post-stress Bvdss magnitude of 36V) with increasing stress time. The second device (after application of stress for the maximum duration) broke down in response to a voltage $V_D-V_S=V_{DS}=-(36V)$ whose absolute value is well below the device's contemplated use voltage of $V_{DS}=-(80V)$. As a result of the $V_{GS}$ stress of −14V, the off state drain current (of the first device) at $V_{GS}=0V$ and $V_{DS}=-(80V)$ rose substantially with increasing stress duration from −6.3 nA (before the stress) to −3.5 mA (after application of stress for the maximum duration). The described testing indicates that HV-PMOS devices of the described type can exhibit either Bvdss walk-in or walk-out, depending on gate bias under stress.

Figure 3:
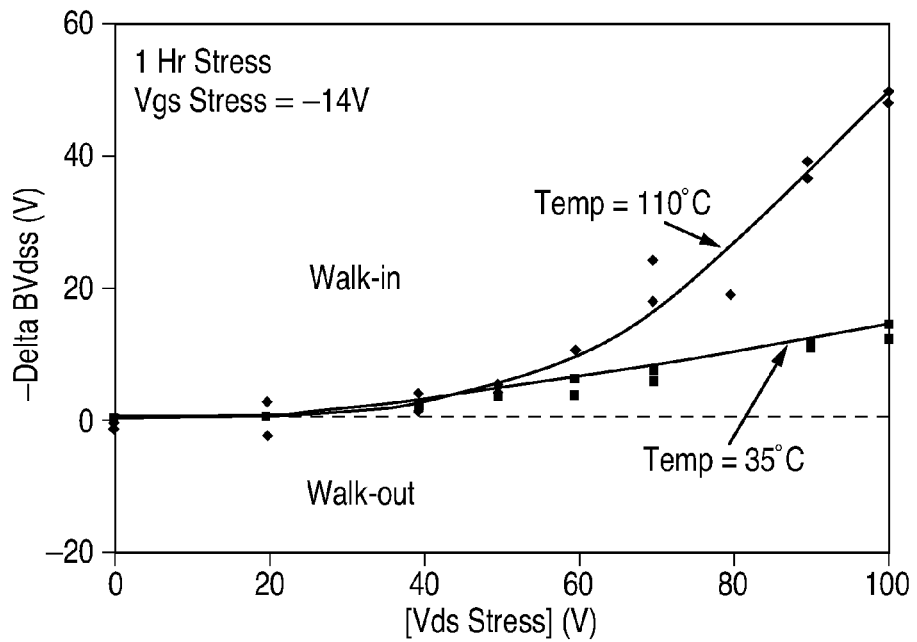
FIG. 3 is a graph of measured Bvdss walk-in (and Bvdss walk-out) of HV-PMOS devices (each having the FIG. 1 structure and a conventionally produced P-LDD implant 6) which resulted from stressed operation of the devices for one hour at various drain stress voltages (at a temperature of 35° C. or 110° C.) with a gate stress voltage (a $V_{GS}$ stress) of −14V.
Figure 4:
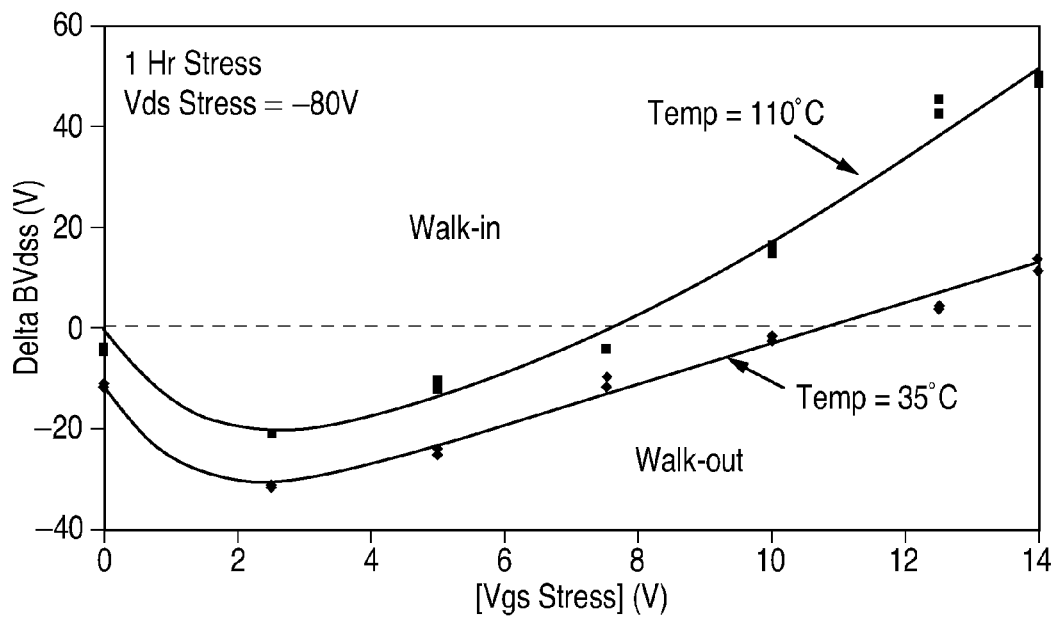
FIG. 4 is a graph of measured Bvdss walk-in (and Bvdss walk-out) of HV-PMOS devices (each having the FIG. 1 structure and a conventionally produced P-LDD implant 6) which resulted from stressed operation of the devices for one hour at various gate stress voltages (at a temperature of 35° C. or 110° C.) with a drain stress voltage (a $V_{DS}$ stress) of −80V.

To better understand this instability, the inventors subjected HV-PMOS devices of the above-described type to stress for one hour at various drain and gate stress voltages and temperatures (35° C. and 110° C.) while monitoring Bvdss. FIG. 3 and FIG. 4 show results of these tests. FIG. 3 shows that for a gate stress voltage of −14V (a $V_{GS}$ stress of −14V), Bvdss walk-in increased with absolute magnitude of $V_{DS}$ and with temperature.

It can be seen from FIG. 4 that the devices exhibited both Bvdss walk-in (at low absolute values of $V_{GS}$, for both 35° C. and 110° C. operation) and Bvdss walk-out (at high absolute values of $V_{GS}$, for both 35° C. and 110° C. operation), that depend on gate voltage stress (Vgs stress) and temperature. In particular, FIG. 4 shows that (for a $V_{DS}$ stress voltage of −80V), Bvdss degradation is a function of $V_{GS}$, with Bvdss degradation crossing over from walk-in to walk-out when $V_{GS}$ decreased to a value approximately equal to −9V. In FIGS. 3 and 4, each data point represents a unique tested device.

Figure 5:
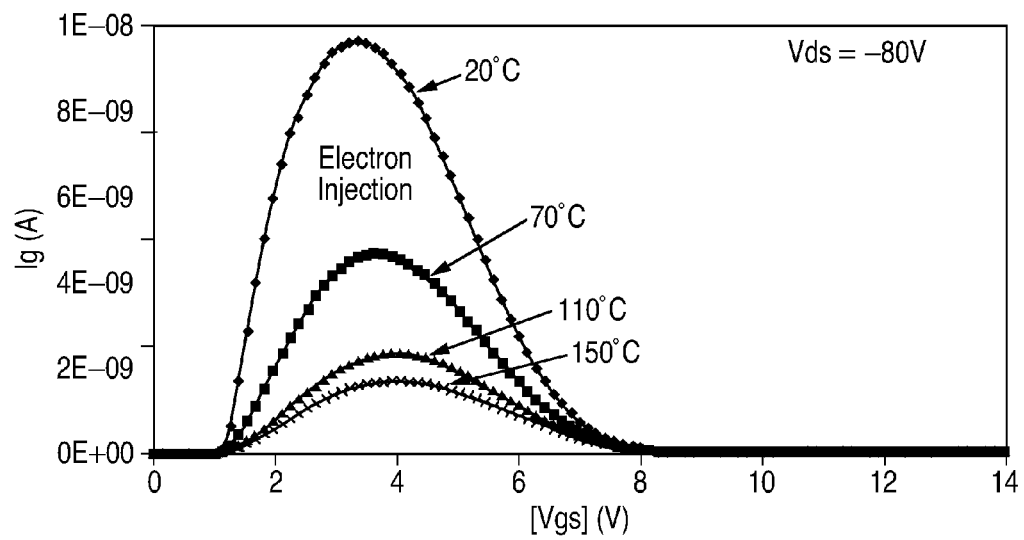
FIG. 5 is a graph of measurements of gate current versus $V_{GS}$, of HV-PMOS devices (each having the FIG. 1 structure and a conventionally produced P-LDD implant 6), with $V_{DS}$=−80V applied between the drain and source of each device, at temperatures of 20° C., 70° C., 110° C., and 150° C.

Additional measurements of gate current versus $V_{GS}$ and temperature (of HV-PMOS devices having the FIG. 1 structure, with $V_{DS}=-80V$) are graphed in FIG. 5. These measurements indicate that for $|V_{GS}|<9V$, substantial gate current flows (with the current direction consistent with electron injection into the gate) and that the electron injection decreases with increasing temperature. For example, in FIG. 5, the curve indicative of data obtained at 20 degrees Celsius shows more electron injection than the curve indicative of data obtained at 70 degrees Celsius, the curve indicative of data obtained at 70 degrees Celsius shows more electron injection than the curve indicative of data obtained at 110 degrees Celsius, and the curve indicative of data obtained at 110 degrees Celsius shows more electron injection than the curve indicative of data obtained at 150 degrees Celsius. Additional testing (to determine threshold voltage degradation with $V_{DS}=-80V$, at a stress temperature of 150° C.) established that the magnitude of the devices' threshold voltage decreased with stress time at $V_{GS}=-(3.5V)$, consistent with electron injection into the gate and/or gate oxide, and that the magnitude of the threshold voltage increased with stress time at $V_{GS}=-(14V)$, consistent with positive charge injection into the gate and/or gate oxide. The test results suggest that electron injection into the gate oxide (as a result of ionization caused by hot carriers in the drain or body (e.g., in the P-LDD implant and/or P-body and/or silicon structure adjacent to the P-LDD implant or P-body) is responsible for drain breakdown voltage (Bvdss) walk-out, and injection of positive charge into the gate oxide (also as a result of ionization caused by hot carriers in the drain or body (e.g., in the P-LDD implant and/or P-body and/or silicon structure adjacent to the P-LDD implant or P-body) is responsible for drain breakdown voltage (Bvdss) walk-in.

Consistent with the theory that charge injection to the gate oxide of a PMOS device (as a result of hot carrier ionization) causes Bvdss walk-in and walk-out, the relative location of the drain junction breakdown point, maximum impact ionization point, and gate oxide of a PMOS device is identified as being of critical importance to reducing Bvdss walk-in in accordance with the invention. In a class of embodiments of the invention, a PMOS device is designed and manufactured with at least one of its drain junction breakdown point and maximum impact ionization point located sufficiently far from its gate (and gate oxide) so that the device exhibits reduced drain breakdown voltage (Bvdss) walk-in. Preferably, both the drain junction breakdown point and maximum impact ionization point are located sufficiently far from the gate oxide so that the device exhibits no significant Bvdss walk-in.

Figure 6:
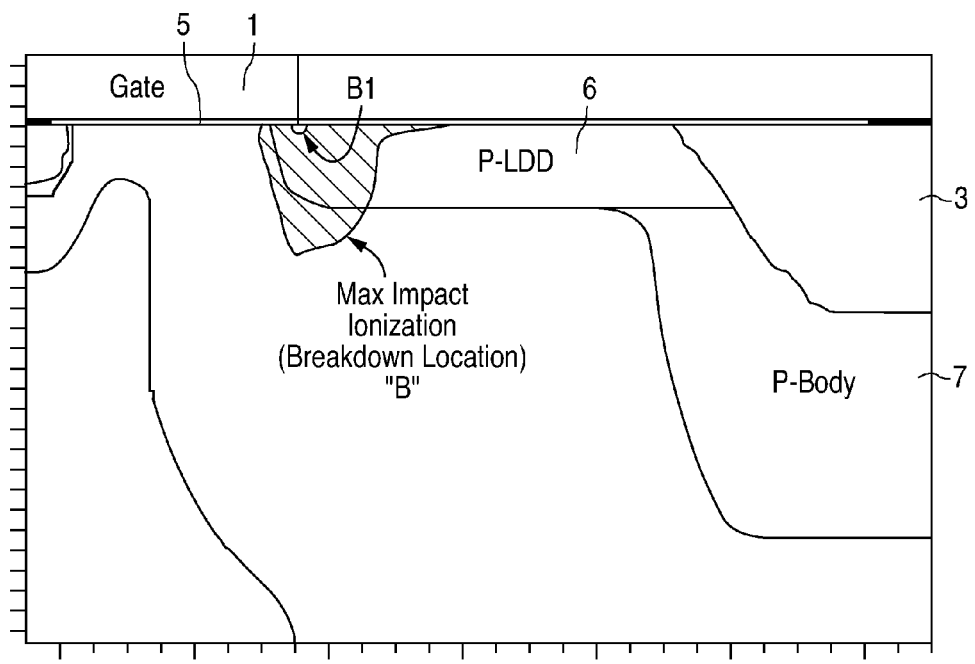
FIG. 6 is a simulation of the drain junction breakdown point and maximum impact ionization point of an HV-PMOS device having the FIG. 1 structure, in which P-LDD implant 6 is produced conventionally by implanting boron with an implant dose of $2.23 \times 10^{12}$ ions/cm$^2$ and an implant energy of 50 Kev.

The inventors have simulated an HV-PMOS device having the FIG. 1 structure, in which P-LDD implant 6 had been produced conventionally by implanting boron with an implant dose of $2.23 \times 10^{12}$ ions/cm$^2$ and an implant energy of 50 Kev. Some of the simulation results are set forth as FIG. 6. In FIG. 6, gate 1, drain 3, gate oxide 5, P-LDD implant 6, and P-Body 7 correspond to the identically numbered elements of the FIG. 1 device. The simulation results (including FIG. 6) suggest that the drain junction breakdown point of the HV-PMOS device is at (or near) the gate edge and at (or near) the Si—SiO$_2$ interface (e.g., near location "A" of FIG. 1, or region "B" of FIG. 6). In FIG. 6, hatched region "B" (the drain junction breakdown point) is near the edge of gate 1 and near the interface between gate oxide 5 and the underlying silicon structure. Region "B" of FIG. 6 is the subregion (identified by the simulation) of drain junction breakdown point "B" in which the amount of hot carrier ionization is expected to be the greatest.

The drain junction breakdown point location indicated in FIG. 6 was confirmed by measurements, including the gate current measurements set forth in FIG. 5, and measurements of channel current versus $V_{DS}$ obtained from stressed devices having the FIG. 1 structure whose Bvdss magnitude had been reduced to 78V (from 109V) as a result of undergoing stress. The measurements indicated that drain leakage current is a strong function of $V_{GS}$ and decreases with increasing $V_{GS}$ until the threshold voltage (Vt=−0.84V) is exceeded, that the drain junction breakdown point is located at (or near) the interface between the device's gate oxide and silicon structure and at (or near) the interface between the P-LDD implant and the gate oxide (as is region "B" of FIG. 6), and that turning on the transistor's channel eliminates the breakdown leakage path. The gate current measurements set forth in FIG. 5 verify the simulated location of the drain junction breakdown point by showing that considerable gate electron injection occurs during a gate voltage ($V_{GS}$) sweep. Also, breakdown leakage path measurements performed during stress to gate, source, and substrate indicate that the breakdown leakage path does not change during stress and is to the substrate (not the source), so that hot electron induced punch-through (HEIP) is not the degradation mechanism.

Consistent with their recognition that the drain junction breakdown point and maximum impact ionization point of a HV-PMOS device having the FIG. 1 structure coincide at a location near the interface between the device's gate oxide and silicon structure and near the interface between the gate oxide and the P-LDD implant, the inventors theorize that charge injected into the gate oxide during stress changes the local electric field near the drain junction breakdown point which affects the device's drain junction breakdown voltage. According to this theory, electron injection from the P-LDD implant gate into the gate oxide creates a negative surface charge (at the interface between the gate oxide and the underlying silicon) reducing the surface electric field and resulting in Bvdss walk-out, while positive charge injection (from the channel) into the oxide enhances the surface electric field and causes Bvdss walk-in. Results of Bvdss measurements by the inventors support this theory. Some such measurements were made on an unstressed device having the FIG. 1 structure during application of a positive $V_{GS}$ to simulate a stress induced positive surface potential. The latter measurements showed that a positive $V_{GS}$ can cause significant Bvdss walk-in (e.g., walk-in substantially equal to 20V).

In accordance with a class of embodiments of the invention, during the design and manufacture of a PMOS device having the FIG. 1 structure, the P-LDD implant dose is determined to be one which locates the drain junction breakdown point sufficiently far from the gate edge that Bvdss walk-in is eliminated, or reduced below a predetermined target amount. Optimization of P-LDD implant dose in accordance with preferred embodiments of the invention is typically subject to numerous other design constraints.

Figure 7:
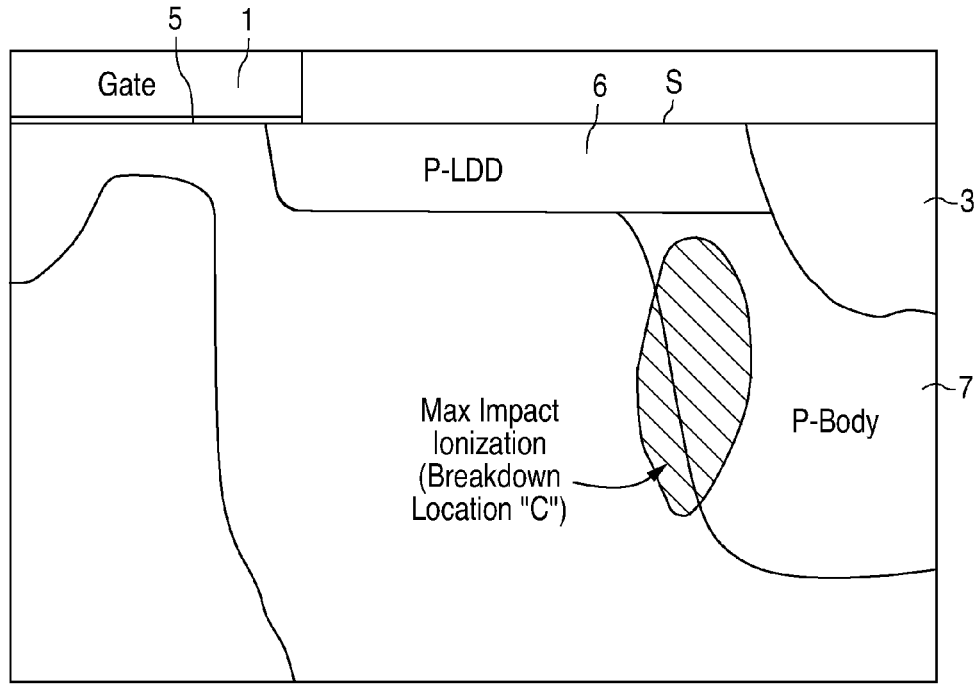
FIG. 7 is a simulation of the drain junction breakdown point and maximum impact ionization point of an HV-PMOS device having the FIG. 1 structure, in which P-LDD implant 6 is produced in accordance with an embodiment of the invention by implanting boron with an implant dose of $1.15 \times 10^{12}$ ions/cm$^2$ and an implant energy of 50 Kev.

The inventors have simulated an HV-PMOS device having the FIG. 1 structure (with gate length of 3.5 mm, gate width of 160 mm, and oxide thickness of 38 nm), in which P-LDD implant 6 is produced in accordance with the invention by implanting boron with an implant dose of $1.15 \times 10^{12}$ ions/cm$^2$ (reduced by about 50% relative to the dose assumed to generate FIG. 6) and an implant energy of 50 Kev, to locate the drain junction breakdown point far from the gate. Some of the simulation results are set forth as FIG. 7. In FIG. 7, gate 1, drain 3, gate oxide 5, P-LDD implant 6, and P-Body 7 correspond to the identically numbered elements of the FIG. 1 device. Surface "S" is the upper surface of the device's silicon structure (excluding gate 1 which is typically composed of polysilicon). It is apparent from FIG. 7 that the drain junction breakdown point of FIG. 7 (hatched region "C," at the junction between P-Body 7 and P-LDD implant 6 and far below surface "S") is much farther from gate 1 and the device than is the drain junction breakdown point "B" of FIG. 6. In contrast, the above-discussed FIG. 6 simulation result (obtained assuming a conventional P-LDD implant dose equal to about twice the dose assumed to generate the FIG. 7 simulation result) shows the drain junction breakdown point (region B in FIG. 6) much closer to gate 1.

By manufacturing the FIG. 7 device, or another PMOS device having a P-LDD implant, in accordance with the invention with a reduced P-LDD implant dose (a P-LDD implant dose that is lower than a conventional dose by an amount determined in accordance with the invention) drain breakdown voltage walk-in can be eliminated, or reduced sufficiently so that the drain breakdown voltage cannot be affected significantly by stress induced charge injection to the gate (so that the drain breakdown voltage would remain at least substantially constant, independent of stress conditions). This is because determining (and preferably optimizing) the P-LDD implant dose in accordance with the invention moves the drain junction breakdown point sufficiently far from the gate (and the device surface) so that charge injected into the gate (and/or into the gate oxide underlying the gate) does not significantly impact the Bvdss breakdown voltage of the device.

Figure 8:
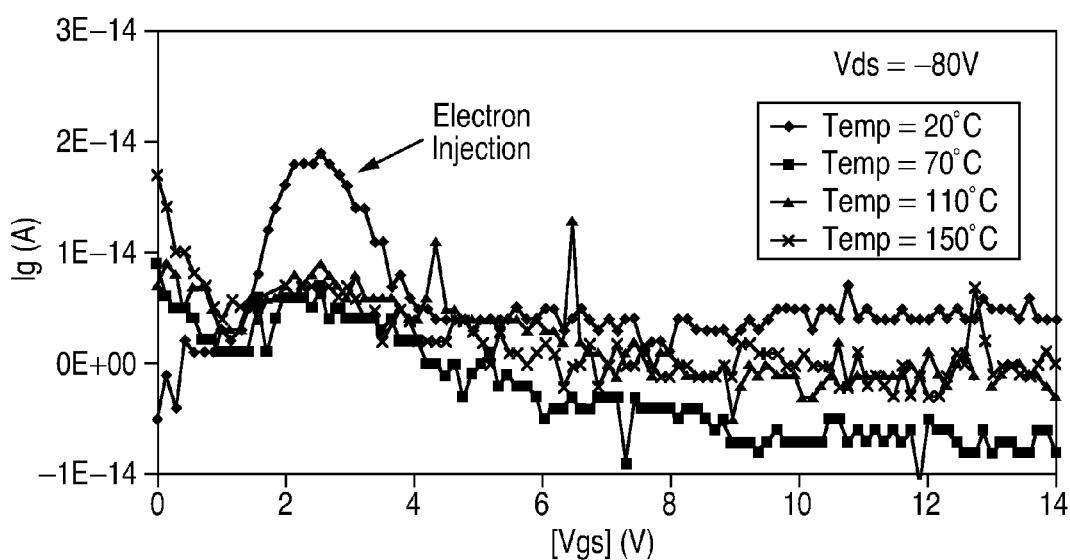
FIG. 8 is a graph of measurements of gate current versus $V_{GS}$, of HV-PMOS devices (each having the FIG. 1 structure and a P-LDD implant 6 produced in accordance with an embodiment of the invention), with $V_{DS}$=−80V applied between the drain and source of each device, at temperatures of 20° C., 70° C., 110° C., and 150° C.

FIG. 8 is a graph of measurements of gate current versus $V_{GS}$ and temperature (of HV-PMOS devices, having the FIG. 1 structure, whose P-LDD implants have been produced in accordance with the invention by implanting boron with an implant dose of $1.15 \times 10^{12}$ ions/cm$^2$ and an implant energy of 50 Kev), with $V_{DS}$=−80V. FIG. 8 shows that gate current injection is virtually eliminated (reduced by on the order of 106) when compared to that (shown in FIG. 5) measured in conventionally manufactured HV-PMOS devices. This improvement is consistent with the fact that the maximum impact ionization point and drain junction breakdown point of each device tested to generate FIG. 8 are far from the edge of the device's gate, whereas the maximum impact ionization point and drain junction breakdown point of each device tested to generate FIG. 5 are much closer to the edge of the device's gate.

Stress-induced injection of positive or negative charge to the gate oxide of any of the HV-PMOS devices measured to generate FIG. 8 has no significant impact on the device's Bvdss breakdown voltage because the device's drain junction breakdown point is within the device's bulk (at the location of breakdown point C of FIG. 7, far from the device's surface S) far from the device's gate, so that the field (at the drain junction breakdown point) exerted by charge accumulated in the gate oxide (as a result of stress-induced injection) would have insignificant strength.

Figure 9:
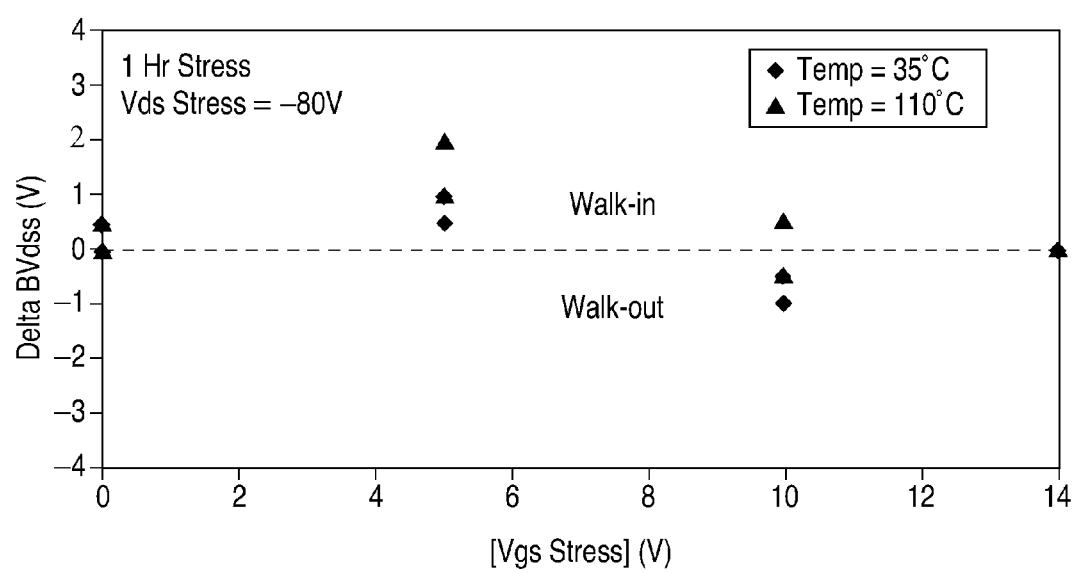
FIG. 9 is a graph of measured Bvdss walk-in (and Bvdss walk-out) of HV-PMOS devices (each having the FIG. 1 structure and a P-LDD implant 6 produced in accordance with an embodiment of the invention) which resulted from stressed operation of the devices for one hour at various gate stress voltages (at a temperature of 35° C. or 110° C.) with a drain stress voltage (a $V_{DS}$ stress) of −80V.

FIG. 9 is a graph of measurements (identical to those graphed in above-discussed FIG. 4) made on devices of the same type that were measured to generate FIG. 8. FIG. 9 shows substantial improvement in the devices' Bvdss breakdown voltage walk-in and walk-out behavior (versus $V_{GS}$) relative to the walk-in and walk-out behavior shown in FIG. 4. FIG. 9 shows that Bvdss breakdown voltage walk-in and walk-out are greatly reduced (to have absolute value not greater than 2V) for the devices manufactured in accordance with the invention, in contrast with the much greater Bvdss breakdown voltage walk-in and walk-out values (shown in FIG. 4) for conventionally manufactured devices.

Additional measurements (made on devices manufactured in accordance with the invention, of the same type measured to generate FIG. 8) have showed that application of positive $V_{GS}$ stress to the inventive devices does not cause Bvdss breakdown walk-in (as was observed for similar devices manufactured with a conventional P-LDD implant dose), and that functional quiescent current failure fallout in operational life testing was virtually eliminated for the inventive devices. In contrast, functional quiescent current failures were observed for similar devices manufactured with a conventional P-LDD implant dose.

It is useful to modify the design of a PMOS device in accordance with the invention (and to manufacture PMOS devices having the modified design) if the unmodified design makes the unmodified device subject to Bvdss walk-in by locating its drain junction breakdown point and maximum impact ionization point near its gate oxide. Hot-carrier-induced ionization in such an unmodified device would contribute to Bvdss walk-in in the device by injecting positive charge to the gate oxide. As a result of such charge injection, the fields exerted by the injected charge (in the gate oxide) on the nearby drain junction breakdown point would affect the drain breakdown process by reducing the drain breakdown voltage. Changing the design in accordance with the invention (e.g., by reducing the implant dose employed to produce a P-LDD implant in an extended drain region of the device) to move both the drain junction breakdown point and "maximum impact ionization point" away from the gate oxide has a double benefit: reducing injection of charge (resulting from hot-carrier-induced ionization) to the gate oxide, and also moving the drain junction breakdown point away from the gate oxide so that any field exerted by the injected charge in the gate oxide will be weaker at the drain junction breakdown point and thus have reduced effect on the breakdown process.

In other embodiments, changing the design of a PMOS device (e.g., a PMOS device having structure different than that shown in FIG. 1) in accordance with the invention moves one (but not both) of the drain junction breakdown point and maximum impact ionization point away from the gate oxide, thereby reducing Bvdss walk-in below a predetermined value or eliminating Bvdss walk-in. If the drain junction breakdown point (of a PMOS device that embodies the invention) is located near the gate oxide but the maximum impact ionization point is not near to the gate oxide, stress-induced injection of charge to the gate oxide can have much less impact on the Bvdss breakdown voltage than in a similar conventional device (whose maximum impact ionization point and drain junction breakdown point are both located near the gate oxide) because there will be less injection of charge (resulting from hot-carrier-induced ionization) to the gate oxide of the inventive device. If the maximum impact ionization point (of a PMOS device that embodies the invention) is located near the gate oxide but the drain junction breakdown point is not near to the gate oxide, stress-induced injection of charge to the gate oxide can have much less impact on the Bvdss breakdown voltage than in a similar conventional device (whose maximum impact ionization point and drain junction breakdown point are both located near the gate oxide) because any field exerted by stress-induced injected charge in the gate oxide will be weaker at the drain junction breakdown point of the inventive device and thus have reduced effect on the breakdown process.

In a class of embodiments, the inventive PMOS device has the FIG. 7 structure (and includes an extended drain region with a lightly doped drain or "LDD" implant), has been manufactured in accordance with a BiCMOS process, and the LDD implant that has been produced by implanting boron with an implant dose of $1.15 \times 10^{12}$ ions/cm$^2$ (and an implant energy of 50 Kev) to locate the maximum impact ionization and drain junction breakdown points away from the gate oxide, and thereby reduce Bvdss walk-in below a predetermined value. In contrast, a PMOS device having the FIG. 6 structure (including an extended drain region with an LDD implant) that has been manufactured in accordance with the same BiCMOS process but with the LDD implant produced by implanting boron with an implant dose of $2.23 \times 10^{12}$ ions/cm$^2$ (and implant energy of 50 Kev) would not embody the invention because its maximum impact ionization and drain junction breakdown points would be located near to the gate oxide, and it thus would be subject to Bvdss walk-in in excess of the predetermined value.

Design parameters of a PMOS device that embodies the invention (including an implant dose for producing a P-LDD implant of an extended drain region of the device) can be determined on a trial and error basis as follows. A first set of design parameters (including a candidate implant dose) is chosen, and simulations are performed to determine locations of one or both of the maximum impact ionization and drain junction breakdown points of a device manufactured in accordance with the first set of design parameters. Then, a second set of design parameters (including another candidate implant dose) is chosen, and simulations are performed to determine locations of one or both of the maximum impact ionization and drain junction breakdown points of a device manufactured in accordance with the second set of design parameters. This process continues until simulations determine a location of at least one (and preferably both) of the maximum impact ionization point and drain junction breakdown point to be sufficiently far from the gate oxide to reduce Bvdss walk-in below a predetermined value, and the corresponding set of design parameters is identified as a best set of design parameters (including a best candidate implant dose).

Other aspects of the invention are methods for designing any embodiment of the inventive PMOS device, and methods for manufacturing an integrated circuit (chip) including any embodiment of the inventive PMOS device.

In a class of embodiments, the invention is a method for designing a PMOS device having a gate, a body, a drain, a drain junction breakdown point within at least one of the body and the drain, and a maximum impact ionization point within at least one of the body and the drain. The method includes the step of (a) determining relative locations of the gate, and at least one of the drain junction breakdown point and maximum impact ionization point, which cause the device to exhibit no drain breakdown voltage walk-in in excess of a predetermined value. Step (a) can be performed in such a manner as to locate both the drain junction breakdown point and the maximum impact ionization point sufficiently far from the gate that the device exhibits no significant drain breakdown voltage walk-in (e.g., in such a manner that any drain breakdown voltage walk-in exhibited by the device has absolute magnitude not greater than two volts).

Step (a) can include the steps of: (b) choosing a first set of design parameters for the device; and (c) performing at least one simulation to determine simulated relative location of the gate and at least one of the maximum impact ionization point and the drain junction breakdown point of a candidate device manufactured in accordance with the first set of design parameters. Optionally also, step (a) also includes the steps of: (d) determining that each of the maximum impact ionization point and the drain junction breakdown point of the candidate device has insufficient simulated distance from the gate of said candidate device to cause said candidate device to exhibit no drain breakdown voltage walk-in in excess of the predetermined value; (e) choosing a second set of design parameters for the device; and (f) performing at least one simulation to determine simulated relative location of the gate and at least one of the maximum impact ionization point and the drain junction breakdown point of a second candidate device manufactured in accordance with the second set of design parameters; and optionally also (g) determining that at least one of the maximum impact ionization point and the drain junction breakdown point of the second candidate device has sufficient simulated distance from the gate of said second candidate device to cause said second candidate device to exhibit no drain breakdown voltage walk-in in excess of the predetermined value.

In another class of embodiments, the invention is a method for designing a PMOS device having a gate, a body, a drain, a drain junction breakdown point within at least one of the body and the drain, a maximum impact ionization point within at least one of the body and the drain, and an extended drain region, the extended drain region is to include the drain, a deep drain implant, and a lightly doped drain implant, at least a portion of the deep drain implant is to be located below the drain, and at least a portion of the lightly doped drain implant is to be located between the drain and the gate. The method includes the step of (a) determining relative locations of the gate, and at least one of the drain junction breakdown point and maximum impact ionization point, which cause the device to exhibit no drain breakdown voltage walk-in in excess of a predetermined value.

Step (a) can include the steps of: (b) choosing a first set of design parameters for the device, including a candidate implant dose for producing the lightly doped drain implant; and (c) performing at least one simulation to determine simulated relative location of the gate and at least one of the maximum impact ionization point and the drain junction breakdown point of a candidate device manufactured in accordance with the first set of design parameters. Optionally also, step (a) also includes the steps of: (d) determining that each of the maximum impact ionization point and the drain junction breakdown point of the candidate device has insufficient simulated distance from the gate of said candidate device to cause said candidate device to exhibit no drain breakdown voltage walk-in in excess of the predetermined value; (e) choosing a second set of design parameters for the device, including a reduced candidate implant dose for producing the lightly doped drain implant, wherein the reduced candidate implant dose is less than the candidate implant dose; and (f) performing at least one simulation to determine simulated relative location of the gate and at least one of the maximum impact ionization point and the drain junction breakdown point of a second candidate device manufactured in accordance with the second set of design parameters; and optionally also (g) determining that at least one of the maximum impact ionization point and the drain junction breakdown point of the second candidate device has sufficient simulated distance from the gate of said second candidate device to cause said second candidate device to exhibit no drain breakdown voltage walk-in in excess of the predetermined value.

In another class of embodiments, the invention is a method for manufacturing an integrated circuit including at least one PMOS device having a gate, a body, a drain formed in the body, a drain junction breakdown point, and a maximum impact ionization point. The method includes the step of (a) producing the gate, the body, and the drain such that the gate, the drain junction breakdown point, and the maximum impact ionization point have relative positions that cause the device to exhibit no drain breakdown voltage walk-in in excess of a predetermined value. Step (a) can be performed in such a manner as to locate both the drain junction breakdown point and the maximum impact ionization point sufficiently far from the gate that the device exhibits no significant drain breakdown voltage walk-in (e.g., so that any drain breakdown voltage walk-in exhibited by the device has absolute magnitude not greater than two volts), or in such a manner as to locate the drain junction breakdown point sufficiently far from the gate to reduce any drain breakdown voltage walk-in exhibited by the device below the predetermined value, or in such a manner as to locate the maximum impact ionization point sufficiently far from the gate to reduce any drain breakdown voltage walk-in exhibited by the device below the predetermined value.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for designing a PMOS device to have a gate, a body, an extended drain region formed in the body, a drain junction breakdown point within at least one of the body and the extended drain region, and a maximum impact ionization point, wherein the extended drain region includes a drain, a deep drain implant, and a lightly doped drain implant between the deep drain implant and the gate, at least a portion of the lightly doped drain implant is located between the drain and the gate, at least a portion of the deep drain implant is located below the drain, and the maximum impact ionization point is located below the lightly doped drain implant within at least one of the body and the extended drain region, said method including the steps of:

(a) determining a location of the gate, and a location of the maximum impact ionization point relative to the location of the gate, such that said location of the gate and said location of the maximum impact ionization point cause the device to exhibit no drain breakdown voltage walk-in in excess of a predetermined value; and (b) manufacturing an integrated circuit including the PMOS device.

2. The method of claim 1, wherein step (a) is performed in such a manner as to locate both the drain junction breakdown point and the maximum impact ionization point sufficiently far from the gate that the device exhibits no significant drain breakdown voltage walk-in.

3. The method of claim 2, wherein step (a) is performed in such a manner that any drain breakdown voltage walk-in exhibited by the device has absolute magnitude not greater than two volts.

4. The method of claim 1, wherein step (a) includes the steps of:

(c) choosing a first set of design parameters for the device; and (d) performing at least one simulation to determine simulated location of the gate of a candidate device manufactured in accordance with the first set of design parameters relative to the maximum impact ionization point of the candidate device.

5. The method of claim 4, wherein step (a) also includes the steps of:

(e) determining that each of the maximum impact ionization point and the drain junction breakdown point of the candidate device has insufficient simulated distance from the gate of said candidate device to cause said candidate device to exhibit no drain breakdown voltage walk-in in excess of the predetermined value;

(f) choosing a second set of design parameters for the device; and (g) performing at least one simulation to determine simulated location of the gate of a second candidate device manufactured in accordance with the second set of design parameters relative to at least one of the maximum impact ionization point and the drain junction breakdown point of the second candidate device.

6. The method of claim 5, wherein step (a) also includes the step of:

(h) determining that at least one of the maximum impact ionization point and the drain junction breakdown point of the second candidate device has sufficient simulated distance from the gate of said second candidate device to cause said second candidate device to exhibit no drain breakdown voltage walk-in in excess of the predetermined value.

7. The method of claim 1, wherein step (a) includes the steps of:

(c) choosing a first set of design parameters for the device, including a candidate implant dose for producing the lightly doped drain implant; and (d) performing at least one simulation to determine simulated location of the gate of a candidate device manufactured in accordance with the first set of design parameters relative to at least one of the maximum impact ionization point and the drain junction breakdown point of the candidate device.

8. The method of claim 7, wherein step (a) also includes the steps of:

(e) determining that each of the maximum impact ionization point and the drain junction breakdown point of the candidate device has insufficient simulated distance from the gate of said candidate device to cause said candidate device to exhibit no drain breakdown voltage walk-in in excess of the predetermined value;

(f) choosing a second set of design parameters for the device, including a reduced candidate implant dose for producing the lightly doped drain implant, wherein the reduced candidate implant dose is less than the candidate implant dose; and (g) performing at least one simulation to determine simulated location of the gate of a second candidate device manufactured in accordance with the second set of design parameters relative to at least one of the maximum impact ionization point and the drain junction breakdown point of the second candidate device.

9. The method of claim 8, wherein step (a) also includes the step of:

(h) determining that at least one of the maximum impact ionization point and the drain junction breakdown point of the second candidate device has sufficient simulated distance from the gate of said second candidate device to cause said second candidate device to exhibit no drain breakdown voltage walk-in in excess of the predetermined value.

10. The method of claim 1, wherein step (a) is performed in such a manner as to locate the drain junction breakdown point and the maximum impact ionization point sufficiently far from the gate to reduce any drain breakdown voltage walk-in exhibited by the device below the predetermined value.

11. The method of claim 1, wherein step (a) is performed in such a manner as to locate the maximum impact ionization point sufficiently far from the gate to reduce any drain breakdown voltage walk-in exhibited by the device below the predetermined value.

* * * * *